US010711369B2

(12) United States Patent
Sato et al.

(10) Patent No.: US 10,711,369 B2
(45) Date of Patent: Jul. 14, 2020

(54) METHOD FOR PRODUCING SILICON CARBIDE SINGLE CRYSTAL AND SILICON CARBIDE SINGLE CRYSTAL SUBSTRATE

(71) Applicant: SHOWA DENKO K.K., Tokyo (JP)

(72) Inventors: Shinya Sato, Tokyo (JP); Tatsuo Fujimoto, Tokyo (JP); Masakazu Katsuno, Tokyo (JP); Hiroshi Tsuge, Tokyo (JP); Masashi Nakabayashi, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 38 days.

(21) Appl. No.: 15/532,791

(22) PCT Filed: Dec. 4, 2015

(86) PCT No.: PCT/JP2015/084185
§ 371 (c)(1),
(2) Date: Jun. 2, 2017

(87) PCT Pub. No.: WO2016/088883
PCT Pub. Date: Jun. 9, 2016

(65) Prior Publication Data
US 2017/0342593 A1 Nov. 30, 2017

(30) Foreign Application Priority Data
Dec. 5, 2014 (JP) ................................. 2014-246912

(51) Int. Cl.
*C30B 23/02* (2006.01)
*C30B 29/36* (2006.01)
(Continued)

(52) U.S. Cl.
CPC .......... *C30B 23/025* (2013.01); *C01B 32/963* (2017.08); *C23C 14/0635* (2013.01); *C23C 14/243* (2013.01); *C30B 29/36* (2013.01)

(58) Field of Classification Search
None
See application file for complete search history.

(56) References Cited

U.S. PATENT DOCUMENTS

2005/0211156 A1 9/2005 Gunjishima et al.
2010/0031877 A1 2/2010 Gupta et al.
(Continued)

FOREIGN PATENT DOCUMENTS

DE 11 2012 005 019 T5 8/2014
JP 2004-323348 A 11/2004
(Continued)

OTHER PUBLICATIONS

JP2008001532 Google translation provided; Dec. 26, 2018.*
(Continued)

*Primary Examiner* — Guinever S Gregorio
(74) *Attorney, Agent, or Firm* — Birch, Stewart, Kolasch & Birch, LLP

(57) ABSTRACT

The present invention provides a method for producing an SiC single crystal, enabling obtaining an SiC single crystal substrate in which a screw dislocation-reduced region is ensured in a wide range, and an SiC single crystal substrate. The SiC single crystal substrate is produced using a seed crystal having an off angle in the off orientation from a {0001} plane by a production method wherein in advance of a growth main step of performing crystal growth to form a facet {0001} plane in the crystal peripheral part on the crystal end face having grown thereon the bulk silicon carbide single crystal and obtain more than 50% of the thickness of the obtained SiC single crystal, a growth sub-step of growing the crystal at a higher nitrogen concentration than in the growth main step and at a growth atmosphere pressure of 3.9 to 39.9 kPa and a seed crystal temperature of 2,100° C. to less than 2,300° C. is included.

4 Claims, 9 Drawing Sheets

(51) Int. Cl.
  *C01B 32/963* (2017.01)
  *C23C 14/06* (2006.01)
  *C23C 14/24* (2006.01)

(56) References Cited

U.S. PATENT DOCUMENTS

| | | |
|---|---|---|
| 2011/0206929 A1 | 8/2011 | Nakabayashi et al. |
| 2012/0060751 A1 | 3/2012 | Urakami et al. |
| 2012/0294790 A1 | 11/2012 | Sasaki et al. |
| 2014/0220325 A1* | 8/2014 | Loboda ............... C30B 23/005 428/215 |
| 2014/0291700 A1 | 10/2014 | Gunjishima et al. |
| 2014/0363607 A1 | 12/2014 | Sato et al. |
| 2015/0167197 A1 | 6/2015 | Ujihara et al. |

FOREIGN PATENT DOCUMENTS

| | | | |
|---|---|---|---|
| JP | 2008-1532 A | | 1/2008 |
| JP | 2008001532 A | * | 1/2008 |
| JP | 2008-74661 A | | 4/2008 |
| JP | 2012-240892 A | | 12/2012 |
| JP | 2014-28757 A | | 2/2014 |
| JP | 2014-40357 A | | 3/2014 |
| JP | 2014-43369 A | | 3/2014 |
| JP | 2014-208590 A | | 11/2014 |
| WO | WO 2013/031856 A1 | | 3/2013 |
| WO | WO 2014/123634 A1 | | 8/2014 |

OTHER PUBLICATIONS

Bando et al., "4H-SiC SBD Dependence of Electrical Properties in 4H-SiC SBD, Epitaxial Dislocations Dependence of Electrical Properties in 4H-SiC SBD," Proceedings of the 19th SiC and Related Wide Bandgap Semiconductors, Oct. 2010, pp. 140-141.

English translation of the International Search Report and Written Opinion of the International Searching Authority (forms PCT/ISA/210 and PCT/ISA/237), dated Dec. 28, 2015, for International Application No. PCT/JP2015/084185.

Ohtani, "Structural Defects in SiC Single Crystal Substrates," Proceedings of the 17th SiC and Related Wide Bandgap Semiconductors, Dec. 2008, pp. 8.

Yamamoto et al., "Influence of Threading Dislocations on Gate Thermal Oxide," Proceedings of the 19th SiC and Related Wide Bandgap Semiconductors, Oct. 2010, pp. 11-12.

Machine English translation of JP 2008-001532 (Jan. 10, 2008).
Machine English translation of JP 2008-074661 (Apr. 3, 2008).
Machine English translation of JP 2014-040357 (Mar. 6, 2014).

* cited by examiner

FIG.3
(a)
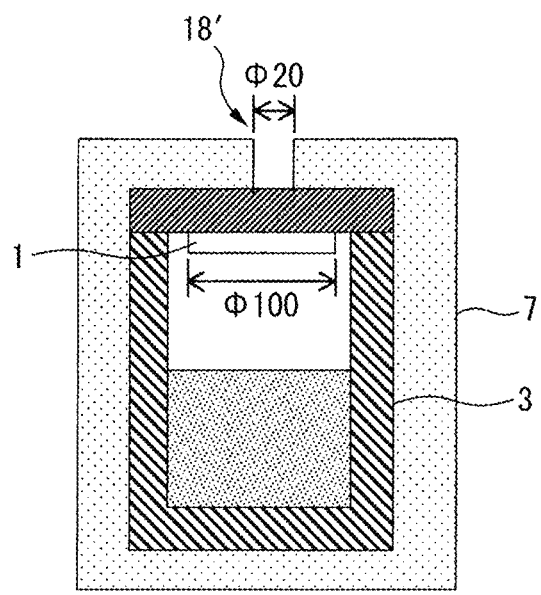
(b)
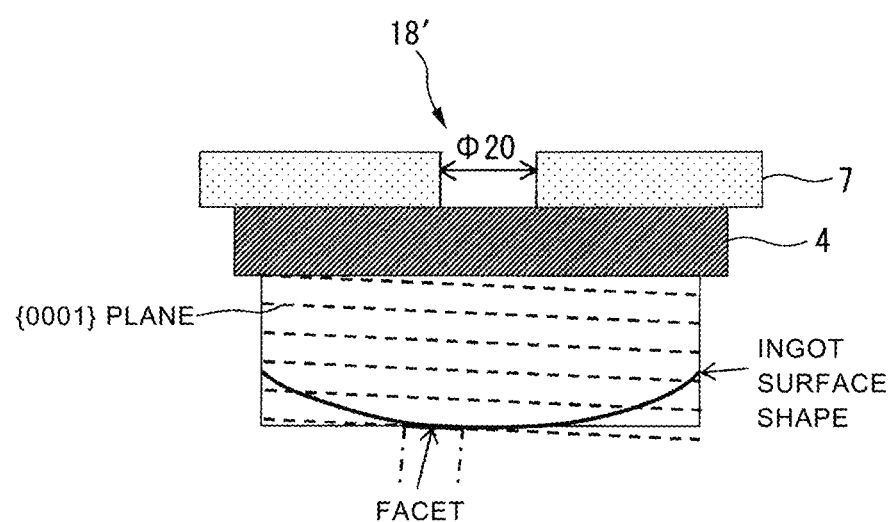

FIG.4
(a)
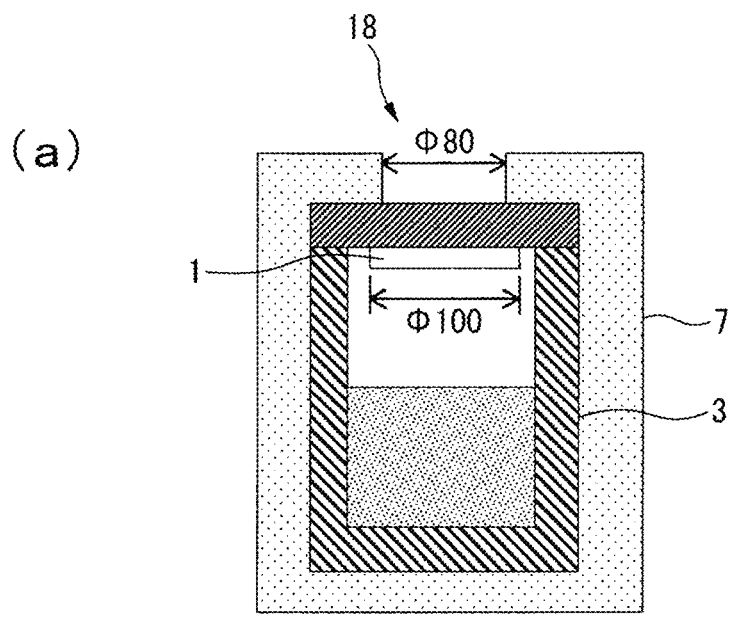
(b)
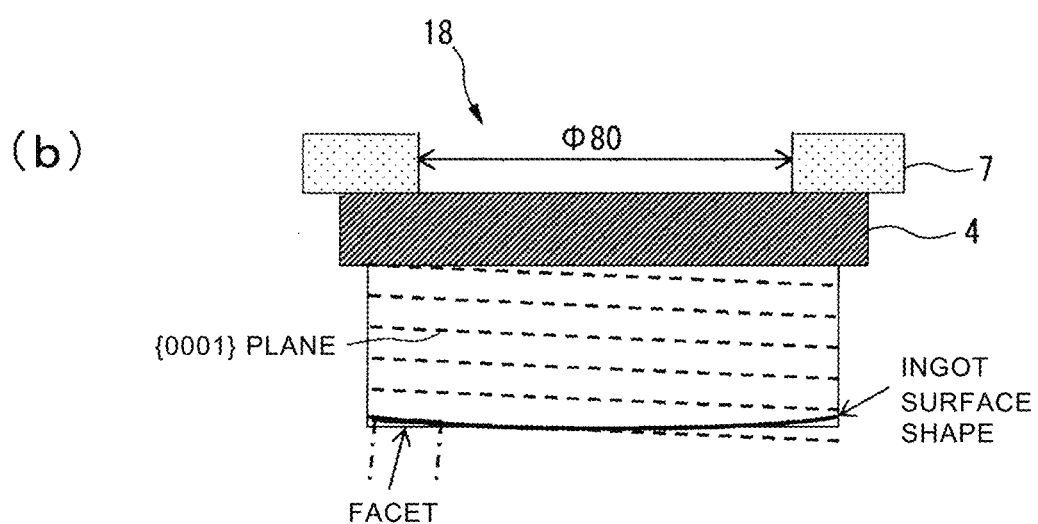

FIG.7
(a) 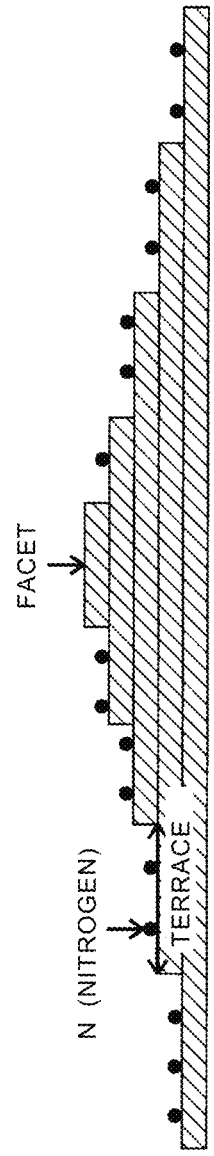
(b) 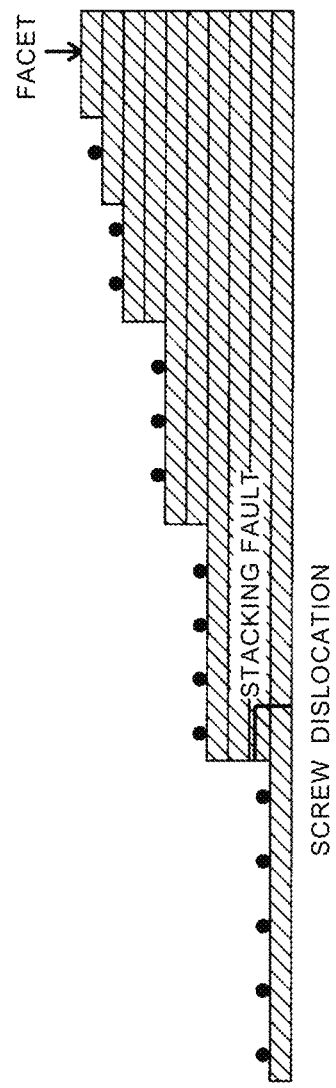

METHOD FOR PRODUCING SILICON CARBIDE SINGLE CRYSTAL AND SILICON CARBIDE SINGLE CRYSTAL SUBSTRATE

TECHNICAL FIELD

The present invention relates to a method for producing a silicon carbide single crystal by sublimating a silicon carbide raw material to grow a bulk silicon carbide single crystal on a seed crystal, and a silicon carbide single crystal substrate.

BACKGROUND ART

Silicon carbide (SiC) is a wide band gap semiconductor having a broad forbidden band width and having properties far surpassing conventional silicon (Si) in terms of voltage resistance, heat resistance, etc., and research and development thereof is a next-generation semiconductor are advancing.

One of the techniques for growing a silicon carbide single crystal (SiC single crystal) is a physical vapor transport (PVT) method. More specifically, in this method, which is also called an Modified-Lely method, a seed crystal composed of SiC is attached to the lid body of a crucible and after placing an SiC raw material in the container body of the crucible, the SiC raw material is sublimated to grow a bulk SiC single crystal on the seed crystal. At this time, an impurity can be doped into the single crystal under growing and, for example, in the case of an n-type SiC single crystal, a nitrogen ($N_2$) gas can be added to the atmosphere gas during growth. A bulk SiC single crystal (ingot) having a substantially columnar shape is obtained and then cut out in general to a thickness of approximately from 300 to 600 μm, and thereafter, an SiC single crystal substrate is produced and used for the manufacture of an SiC device in the fields of power electronics, etc.

The crystal growth by this PVD method requires a temperature in excess of 2,000° C. and moreover, since the crystal growth is per formed by providing a temperature gradient in the crucible where a seed crystal and an SiC raw material are placed, crystal defects such as dislocation defects and stacking faults are anyhow contained in the obtained SiC single crystal. Of these, dislocation defects include threading edge dislocation, basal plane dislocation, and screw dislocation. For example, it has been reported that a commercially available SiC single crystal substrate has approximately from $8\times10^2$ to $3\times10^3$ (/cm$^2$) screw dislocations, from $5\times10^3$ to $2\times10^4$ (/cm$^2$) threading edge dislocations, and from $2\times10^3$ to $2\times10^4$ (/cm$^2$) basal plane dislocations (see Non-Patent Document 1).

In recent years, research and investigation relating to the crystal defects of SiC and the device performance have advanced, and the effects of various defects are becoming clear. Among others, screw dislocation has been reported, for example, to cause a leakage current in a device or decrease the life of a gate oxide film (see Non-Patent Documents 2 and 3). In order to manufacture a high-performance SiC device, an SiC single crystal substrate having less screw dislocations is at least required.

Accordingly, Patent Document 1 discloses a method for producing an SiC single crystal, wherein a bulk SiC single crystal is grown by assigning the growth plane to a plane with an offset angle (off angle) of 60° or less from a {0001} plane and using a dislocation-controlled seed crystal having, in a region corresponding to 50% or less of the growth plane, a screw dislocation-generatable region capable of generating screw dislocations with a higher density than at the periphery of an SiC single crystal under growing and at the time of growth, a silicon carbide single crystal is grown such that a region formed by projecting the screw dislocation-generatable region in the c-axis direction overlaps with the c-plane facet. In Patent Document 1, it is disclosed that by this production method, as SiC single crystal having a region with a high screw dislocation density and a region with a lower screw dislocation density than the region above can be manufactured.

However, in this production method, c-plane growth for growing the crystal in the c-axis direction and a-plane growth for growing the crystal in a direction perpendicular thereto must be performed so as to obtain the dislocation-controlled seed crystal. Moreover, in order to obtain an SiC single crystal having many regions with a low screw dislocation density according to this method, after preparing a dislocation-controlled seed crystal more reduced in the screw dislocation-generatable region by repeating those c-plane growth and a-plane growth, an SiC single crystal needs to be grown. Thus, this production method has a problem with productivity.

Patent Document 2 discloses a method for producing an SiC single crystal, including a first growth step of growing a silicon carbide single crystal to a thickness of at least 0.5 mm at a first growth atmosphere pressure of 3.9 to 39.9 kPa and a first growth temperature with the temperature of the seed crystal being from 2,100° C. to less than 2,300° C., and a second growth step of growing the silicon carbide single crystal to a larger thickness than in the first growth step at a second growth atmosphere pressure of 0.13 to 2.6 kPa and a second growth temperature with line temperature of the seed crystal being higher than the first growth temperature and being less than 2,400° C. Patent Document 2 discloses a method for obtaining a silicon carbide single crystal substrate having less screw dislocations in the peripheral part than in the central part of the substrate, which is cut out from a bulk silicon carbide single crystal grown by the above-described method for producing an SiC single crystal.

According to this method, in the first growth step, the screw dislocation in the SiC single crystal is structurally converted to a stacking fault. In particular, such a structural conversion is likely to occur in the peripheral part compared with the central part of the growth surface in the process of growing of an SiC single crystal, and the screw dislocation density in the peripheral part can be reduced to about one-tenth relative to the central part of the substrate. This method is therefore very effective as a method for decreasing the number of screw dislocations. However, the region in which the number of screw dislocations decreases is a doughnut-like peripheral region excluding the central part of the substrate, and there is room for studies from the viewpoint of more increasing the device yield.

In connection with the method of Patent Document 1, Patent Document 3 discloses a method for producing an SiC single crystal ingot, in which a (0001) facet plane is formed in the edge part of an SiC single crystal ingot by using, as a seed crystal, a base substrate having an off angle of 0.1 to 10° in the <11-20> direction (or <1-100> direction) with respect to (0001) plane. In Patent Document 3, it is disclosed that since nitrogen is readily captured in the portion below the surface having formed thereon the facet plane, a region having a relatively low nitrogen concentration is formed on the center side of the SiC single crystal ingot and an SiC single crystal substrate having a reduced variation in the nitrogen concentration is obtained. According to this method, the number of dislocations is supposed to be decreased substantially in the entire region of the obtained ingot, but the detailed mechanism of decreasing the number of dislocations is unclear, and in addition, although it is supposed that the etch pit density of the obtained SiC single crystal could be reduced to ½ to ½₀ of that ($1\times10^4$ to $5\times10^4$ $cm^{-2}$) of the base substrate, how the dislocations are practically distributed in the substrate is unknown.

Patent Document 4 discloses a production method including a first growth step of growing a silicon carbide single crystal at a first growth atmosphere pressure of 3.9 to 39.9 kPa and a first growth temperature with the temperature of the seed crystal being from 2,100° C. to less than 2,300° C., and a second growth step of growing the silicon carbide single crystal to a larger thickness than in the first growth step at a second growth atmosphere pressure of 0.13 to 2.6 kPa and a second growth temperature with the temperature of the seed crystal being higher than the first growth temperature and being less than 2,400° C. In Patent Document 4, it is disclosed that the screw dislocation is structurally converted to a stacking fault in the first growth step, and the temperature of the seed crystal is raised in the second growth step, whereby a high-speed growth can be performed with good productivity while obtaining a high-quality silicon carbide single crystal.

Patent Document 5 discloses a production method of performing the crystal growth of a silicon carbide single crystal in the slate of an impurity being added so as to control the volume resistivity, by using a seed crystal in which the crystal growth plane has an offset angle of 2 to 15° from a {0001} plane. In Patent Document 5, it is disclosed that when an SiC single crystal substrate cut out from such a crystal is used, a high-performance semiconductor device of an extremely small electrical power loss can be manufactured with good yield.

Patent Document 6 discloses a method for producing an epitaxial silicon carbide single crystal substrate, including forming, on the substrate, a plurality of suppression layers having different nitrogen concentrations for controlling the basal plane dislocation density, and forming, on the suppression layer, an active layer of a silicon carbide single crystal thin film. In Patent Document 6, it is disclosed that by stepwise changing the nitrogen concentration, an appropriate crystal strain not newly causing a crystal dislocation can to produced at the interface between respective suppression layers or at the interface between a suppression layer and an active layer, making it possible to concentrate the strain at the interface, and this effectively acts to suppress the occurrence of basal plane dislocation.

Patent Document 7 discloses a method wherein an SiC single crystal boule is grown by sublimation on an SiC single crystal seed while making a change in the temperature, a change in the temperature gradient, and a change in the composition and pressure of atmosphere gas, and a threading dislocation during growth of an SiC single crystal boule is thereby converted to a basal plane dislocation to allow the threading dislocation density of the grown SiC single crystal boule to substantially decrease as it proceeds from the initially grown boule to the finally grown boule. In Patent Document 7, it is disclosed that propagation of a threading dislocation during growth from the seed to the grown crystal is minimized by this method.

However, none of Patent Documents 1 to 7 discloses that a method for producing a silicon carbide single crystal wherein a screw dislocation-reduced region is ensured in a wide range by efficiently reducing occurrence of screw dislocation while spiral growth centering on screw dislocation is utilized. In addition, it is neither disclosed nor suggested in any of Patent Documents 1 to 7 that the nitrogen partial pressure in the growth atmosphere and the step supply from the facet affect the reduction in the screw dislocation density

RELATED ART

Patent Document

[Patent Document 1] Kokai (Japanese Unexamined Patent Publication) No. 2004-323348
[Patent Document 2] International Publication WO No. 2013/031856 Pamphlet
[Patent Document 3] Kokai No. 2012-240892
[Patent Document 4] Kokai No. 2014-28757
[Patent Document 5] Kokai No. 2008-1532
[Patent Document 6] Kokai No. 2008-74661
[Patent Document 7] Kokai No. 2014-208590

Non-Patent Document

[Non-Patent Document 1] Noboru Ohtani, 17th Meeting on SiC and Related Wide Bandgap Semiconductors, Proceedings, 2008, page 8
[Non-Patent Document 2] Bando et al., 19th Meeting on SiC and Related Wide Bandgap Semiconductors, Proceedings, 2010, pages 140-141
[Non-Patent Document 3] Yamamoto et al., 19th Meeting on SiC and Related Wide Bandgap Semiconductors, Proceedings, 2010, pages 11-12

SUMMARY OF THE INVENTION

Problems to be Solved by the Invention

Accordingly, an object of the present invention is to provide a method for producing an SiC single crystal, enabling efficient reduction in screw dislocation of an SiC single crystal obtained by a PVD method and obtaining an SiC single crystal substrate in which the screw dislocation-reduced region is ensured in a wide range. Another object of the present invention is to provide an SiC single crystal substrate in which the screw dislocation-reduced region is ensured in a wide range.

Means to Solve the Problems

The present inventors have made intensive studies on a technique for obtaining an SiC single crystal substrate, in which the screw dislocation of an SiC single crystal obtained by a PVD method can be efficiently reduced and in consideration of the yield, etc., of an SiC device, the screw dislocation-reduced region is ensured in a wide range. The present inventors have found that when, in advance of a growth main step of growing an SiC single crystal to form a facet (0001} plane in the crystal peripheral part of the crystal end face having grown thereon a bulk SiC single crystal and performing main crystal growth, a growth sub-step of performing crystal growth at a high nitrogen concentration under predetermined pressure and temperature conditions is included, a bulk SiC single crystal capable of attaining the objects above can be obtained. The present invention has been accomplished based on this finding.

That is, the gist of the present invention resides in the followings.

(1) A method for producing a silicon carbide single crystal, comprising placing a seed crystal composed of silicon carbide on a crucible lid body of a crucible having a crucible container body and the crucible lid body, placing a silicon carbide raw material in the crucible container body, and sublimating the silicon carbide raw material to grow a bulk silicon carbide single crystal on the seed crystal, wherein the seed crystal has an off angle in an off orientation from a {0001} plane, and wherein in advance of a growth main step of performing crystal growth to form a facet {0001} plane in a crystal peripheral part on a crystal end face having grown thereon the bulk silicon carbide single crystal and obtain more than 50% of a thickness of the obtained SiC single crystal, a growth sub-step of growing the crystal at a higher nitrogen concentration than in the growth main step and at a growth atmosphere pressure of 3.9 to 39.9 kPa and a seed crystal temperature of 2,100° C. to less than 2,300° C. is included.

(2) The method for producing a silicon carbide single crystal according to (1), wherein the crystal growth rate in the growth sub-step is 0.1 mm/h or less.

(3) The method for producing a silicon carbide single crystal according to (1) or (2), wherein the nitrogen concentration in the crystal in the growth sub-step is from $2 \times 10^{19}$ to $1 \times 10^{20}$ cm$^{-3}$.

(4) The method for producing a silicon carbide single crystal according to any one of (1) to (3), wherein in the growth main step, the nitrogen concentration in the crystal is from $1 \times 10^{18}$ to $1 \times 10^{20}$ cm$^{-3}$, the growth atmosphere pressure is from 0.13 to 2.6 kPa, and the temperature of the seed crystal is higher than in the growth sub-step and is less than 2,400° C.

(5) The method for producing a silicon carbide single crystal according to any one of (1) to (4), wherein the facet {0001} plane is formed by forming the bulk silicon carbide single crystal on the main plane of the seed crystal such that in the process of growing of a bulk silicon carbide single crystal, the growth surface comes to have a curved surface in the growth peripheral part and be made flat in the growth central part compared with the growth peripheral part.

(6) The method for producing a silicon carbide single crystal according to any one of (1) to (5), wherein the bulk silicon carbide single crystal is grown in the growth sub-step until the thickness of the bulk silicon carbide single crystal increases by 1 mm or more, and structural conversion of part of the screw dislocation in the silicon carbides single crystal to a stacking fault and reduction in the screw dislocation density in a region separated from the facet {0001} plane on the crystal end face of the silicon carbide single crystal are thereby achieved in the growth sub-step.

(7) A silicon carbide single crystal substrate having an off angle in the off orientation from {0001} plane, wherein the substrate has a facet {0001} plane in the substrate peripheral part of the substrate surface on the endpoint side of a vector indicating the off orientation and in the screw dislocation density distribution along the substrate diameter from the facet {0001} plane toward the starting point direction of the vector indicating the off orientation, a screw dislocation density distribution boundary showing an abrupt rise in the decrease rate of the screw dislocation density is present.

(8) The silicon carbide single crystal substrate according to (7), wherein in both the screw dislocation density distribution along a straight line having an angle of +45° relative to the substrate diameter and the screw dislocation density distribution along a straight line having an angle of −45° relative to the substrate diameter, a screw dislocation density distribution boundary showing a sharp drop in the screw dislocation density is present.

It is known that in the PVD method, a composite dislocation is produced from a basal plane dislocation with a Burgers vector of ⅓<11−20>(0001) propagating in the basal plane, in addition to a screw dislocation having a Burgers vector of <0001> (D. Nakamura et al., Journal of Crystal Growth, 304 (2007) 57-3), and the screw dislocation referred to in the present invention encompasses this composite screw dislocation.

Effects of the Invention

According to the method for producing an SiC single crystal of the present invention, the screw dislocation of an SiC single crystal can be efficiently reduced and moreover, an SiC single crystal substrate in which a screw dislocation-reduced region is ensured in a wide range, can be obtained. According to the SiC single crystal substrate of the present invention, a screw dislocation-reduced region is ensured in a wide range, so that a high-quality SiC device can be obtained with good yield.

BRIEF DESCRIPTION OF THE DRAWINGS

FIG. 3 (*a*): is a longitudinal cross-sectional view schematically illustrating a structure where a heat-releasing hole having a sufficiently small diameter φ compared with the diameter Φ of a SiC seed crystal is provided in the heat-insulating material covering the crucible lid body to which a SiC seed crystal is attached, and (b) is a longitudinal cross-sectional view schematically illustrating the positional relationship of the heat-releasing hole of the heat-insulating material, the surface shape of the SiC single crystal, and the facet in the single crystal growing apparatus illustrated in (a).

FIG. 4 (*a*) is a longitudinal configuration diagram schematically illustrating a structure where the diameter of the heat-releasing hole in the heat-insulating material covering the lid body to which a SiC seed crystal is attached is increased, and (b) is a longitudinal cross-sectional view schematically illustrating the positional relationship of the heat-releasing hole of the heat-insulating material, the surface shape of the SiC single crystal, and the facet in the single crystal growing apparatus illustrated in (a), FIG. 5 An explanatory view schematically illustrating how a crystal of SiC grows with step-flow growth and spiral growth.

FIG. 7 (*a*) and (*b*) are explanatory views schematically illustrating the mechanism of step formation due to an increase in the N amount on the terrace and the relationship between the height of step and the position of facet.

MODE FOR CARRYING OUT THE INVENTION

The present invention is described in detail below.

The production method of the present invention is a method for producing an SiC single crystal, which comprises including placing a seed crystal (SiC seed crystal) composed of silicon carbide on a crucible lid body of a crucible having a crucible container body and the crucible lid body, placing an SiC raw material in the crucible container body, and sublimating the SiC raw material to grow a bulk SiC single crystal on the SIC seed crystal. The SiC seed crystal is cut out such that a {0001} plane and a main plane form a predetermined off angle so as to orient the normal line of the {0001} plane in a predetermined off orientation on the main plane (or the surface). The production method of the present invention includes, in advance of a growth main step of forming a facet {0001} plane in the crystal peripheral part on the crystal end face having grown thereon the bulk SiC single crystal and performing main crystal growth, a growth sub-step employing growth conditions different from those in the growth main step.

The facet {0001} plane as used herein is a smooth surface generated, at the time of growing an SiC single crystal, only in a region having an angle perpendicular to the <0001> direction that is the c-axis of the crystal. Accordingly, in order to allow a facet {0001} plane to be formed in the crystal peripheral part on the crystal end face by using an SiC seed crystal sliced such that the normal line of the {0001} plane has a predetermined off orientation and forms a predetermined off angle relative to the main plane, at least part of the crystal peripheral part needs to be formed in the same direction as the direction of a three-dimensional vector having the off orientation and the off angle.

Figure 2:
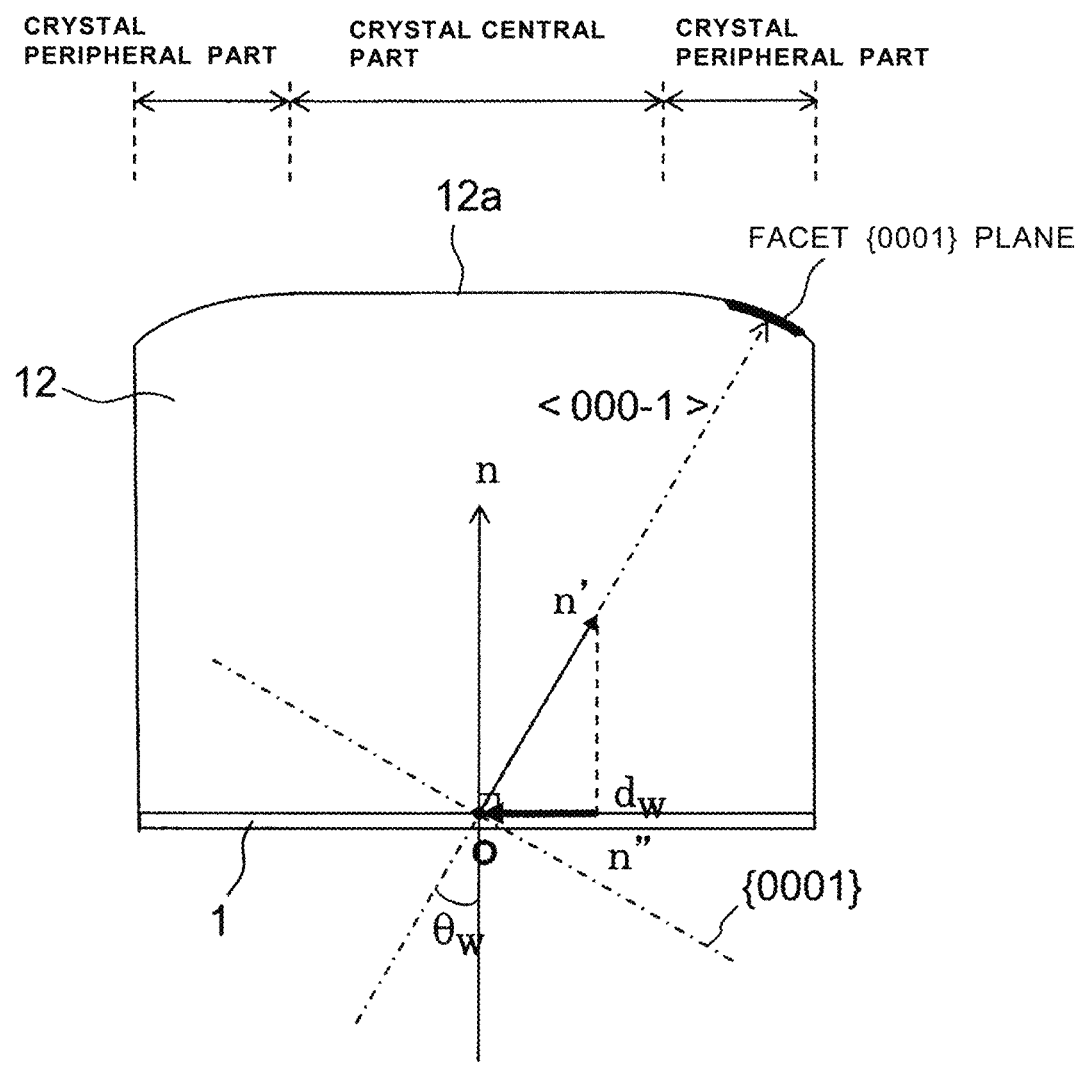
FIG. 2 A schematic longitudinal cross-sectional view illustrating the process of a facet {0001} plane being formed in the crystal peripheral part on the crystal end face of the SiC single crystal of the present invention.

Such a facet {0001} plane may be formed by growing the crystal, as illustrated in FIG. 2, such that in the process of growing of a bulk SiC single crystal 12, the growth surface comes to have a curved surface in the growth peripheral part and be made flat in the growth central part compared with the growth peripheral part. Consequently, the obtained SiC single crystal 12 takes on a gentle convex shape, with the crystal central part of the crystal end face 12a being flat and the crystal peripheral part having a curved surface, and a facet {0001} plane is formed in the crystal peripheral part on the crystal end face 12a of the SiC single crystal 12, which is on the endpoint side of a vector indicating the off angle dW of the SiC seed crystal 1.

In order to allow a facet {0001} plane to be formed as described above in the crystal peripheral part on the crystal end face of the SiC single crystal, an SiC seed crystal in which a {0001} plane has an off angle relative to the main plane is used. At this time, the off orientation dW and the angle of the off angle θW are not particularly limited, but considering the current condition, etc., of device manufacture, the off orientation dW is preferably either the <11-20> direction or the <1-100> direction. In addition, since many substrates used for device manufacture are a 4° off substrate, the angle of the off angle θW is preferably from more than 0° to 16°, more preferably from 2 to 8°.

Here, as illustrated in FIG. 2, the off angle θW is an angle between the normal line n of the main plane (or the surface of the SiC seed crystal 1) and the <0001> direction (c-axis direction). The off orientation dW is a direction of an n" vector formed by projecting the normal vector n' of the {0001} plane of the SiC seed crystal 1 on the main plane (or the surface) of the SiC seed crystal 1.

The technique for allowing a facet {0001} plane to be formed in the crystal peripheral part on the crystal end face of the SiC single crystal in such a manner that in the process of growing of the SiC single crystal 12, the growth surface comes to have a curved surface in the growth peripheral part and be made flat in the growth central part compared with the growth peripheral part, is not particularly limited. As an example of this technique, there is a method of controlling the shape of the growth surface of the SiC single crystal by adjusting the diameter of the heat-releasing hole in the heat-insulating material covering the crucible lid body to which an SiC seed crystal is attached.

More specifically, as illustrated in FIG. 3(a), when the diameter φ 20 of the heat-releasing hole 18' is sufficiently small compared with the diameter Φ 100 of the SIC seed crystal 1 (for example, approximately φ≤⅓Φ), the temperature in the crystal central part above which the heat-releasing hole exists is equalized, and the temperature in the peripheral part is high compared with the crystal central part. Accordingly, as illustrated in FIG. 3(b), the ingot surface shape of the SiC single crystal becomes a convex shape, and the facet {0001} plane is formed substantially at the center of the crystal end face of the SiC single crystal.

On the other hand, as illustrated in FIG. 4(a), when the diameter of the heat-releasing hole 18 is increased (Φ80 in FIG. 4(a)), the crystal region above which the heat-releasing hole 18 is present to equalize the temperature is broadened and therefore, an ingot of the SiC single crystal grows to provide a surface shape of being flat in the crystal central part and having a curve surface only in the crystal peripheral part. Consequently, as illustrated in FIG. 4(b), the facet {0001} plane is formed in the crystal peripheral part on the crystal end face of the SiC single crystal. FIGS. 4(a) and (b) illustrate an example where, with respect to the diameter Φ100 (=100 mm) of the SiC seed crystal, the diameter of the heat-releasing hole 18 in the heat-insulating material, which is concentric with the diameter Φ100 of the SiC seed crystal, is set to be φ80 (=80 mm). However, for forming a facet {0001} plane in the crystal peripheral part, the diameter Φ of the heat-releasing hole of the heat-insulating material is preferably set to be from 40 to 80%, more preferably from 60 to 80%, of the diameter Φ of the SIC seed crystal.

Other techniques for allowing the growth surface to have a curved surface in the growth peripheral part and be made flat in the growth central part compared with the growth peripheral part include a method where the temperature distribution during crystal growth is adjusted, for example, as to the heat-insulating material covering the crucible lid body, by reducing the thickness of the heat-insulating material in the portion corresponding to the growth central part, compared to the portion corresponding to the growth peripheral part, or as to the crucible lid body composed of a graphite member, etc., by increasing the thermal conductivity in the portion corresponding to the growth central part, compared to the portion corresponding to the growth peripheral part, and the ingot surface shape is thereby controlled.

In the present invention, in advance of a growth main step of forming a facet {0001} plane in the crystal peripheral part on the crystal end face having grown thereon the bulk SiC single crystal and performing main crystal growth, a growth sub-step employing growth conditions different from those in the growth main step is included. More specifically, a growth sub-step at a higher nitrogen concentration than in the growth main step and at a growth atmosphere pressure of 3.9 to 39.9 kPa and a seed crystal temperature of 2,100°

C. to less than 2,300° C. is included. The reason for including such a growth sub-step is to reduce the screw dislocation by structurally converting part of the screw dislocation in the SiC single crystal to a stacking fault. Details are described below.

Figure 5:
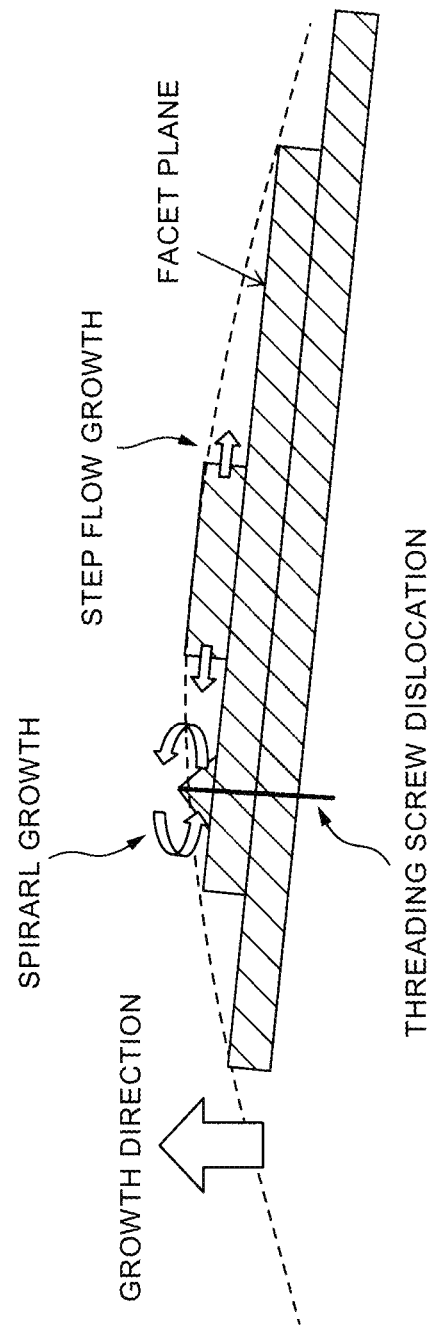

First, the crystal growth of SiC in the PVD method generally includes "step flow growth centering on a facet" and "spiral growth centering on a threading screw dislocation". More specifically, as illustrated in FIG. 5, the major crystal growth is step flow growth. However, in order to more increase the growth rate in the growth direction (that is, "macro growth direction") indicated by an arrow in FIG. 5, spiral growth centering on a threading screw dislocation is required, in addition to step flow growth in a facet.

Figure 6:
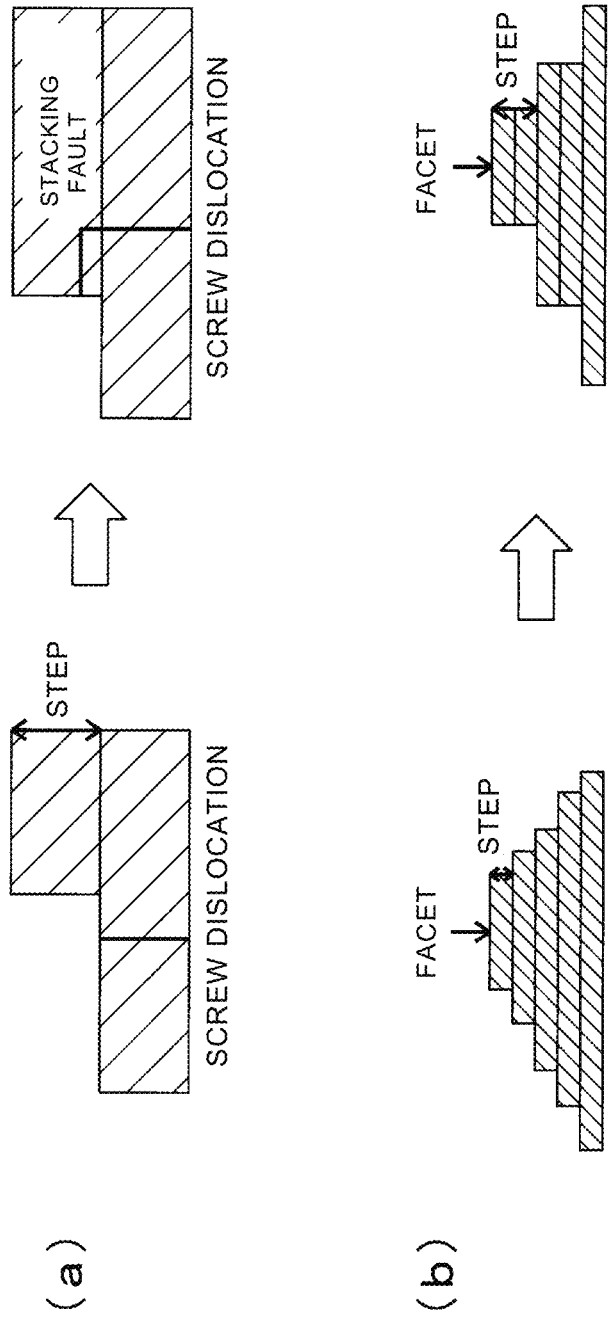
FIG. 6 (*a*) and (*b*) are explanatory views schematically illustrating how a screw dislocation covered by a high step is structurally converted to a stacking fault.

It is considered that in the present invention, the screw dislocation is reduced because, as illustrated in FIG. 6(a), a screw dislocation is covered by a high step and the dislocation extension direction is deflected by 90° and converted to a stacking fault. At this time, as illustrated in FIG. 6(b), a dense step is supplied from the facet to inhibit extension in the lateral direction of a step and cause overlapping of steps (step bunching), and a high step is thereby formed.

In the present invention, as illustrated in FIG. 7(a), a technique of inhibiting the extension in the lateral direction of a step by increasing the nitrogen (N) amount on the terrace is employed. More specifically, in order to increase the N amount on the terrace, in addition to raising the nitrogen partial pressure in the growth atmosphere, the growth rate is suppressed to provide the condition where the step flow growth due to development of the terrace is dominating. At this time, as illustrated in FIG. 7(b), not only a high step is formed resulting from overlapping of steps but also a wide terrace is formed, and since the N amount on the wide terrace increases, extension in the lateral direction of a step is more inhibited. Consequently, it is considered that a high step is likely to be formed at a position more distant from the facet, i.e., at a position farther from the facet, and reduction of the screw dislocation is notably developed.

Accordingly, in the present invention, the crystal is grown in the crystal sub-step by increasing nitrogen concentration to be higher than in the growth main step and suppressing the growth rate. More specifically, in order for step flow growth to dominate by suppressing the growth rate, the growth atmosphere pressure in the growth sub-step is set to be from 3.9 to 39.9 kPa (from 30 to 300 Torr), preferably from 13.3 to 39.9 kPa (from 100 to 300 Torr), and the temperature of the seed crystal is set to be from 2,100° C. to less than 2,300° C., preferably from 2,200° C. to less than 2,300° C. If the growth atmosphere pressure in the growth sub-step is less than 3.9 kPa, the growth rate increases and therefore, spiral growth becomes dominating, as a result, a reduction of the screw dislocation is not efficiently developed, whereas if it exceeds 39.9 kPa, the growth rate is extremely reduced to raise a problem with the productivity. If the temperature of the seed crystal is less than 2,100° C., the growth rate decreases to cause a problem with the productivity, whereas if it is 2,300° C. or more, the growth rate increases, and a reduction of the screw dislocation is not efficiently developed.

From the viewpoint of suppressing two-dimensional nucleation on the wide terrace while more unfailingly inhibiting extension in the lateral direction of a step, the nitrogen concentration in the growth sub-step is adjusted to be preferably from $2\times10^{19}$ to $1\times10^{20}$ cm$^{-3}$, more preferably from $4\times10^{19}$ to $1\times10^{20}$ cm$^{-3}$, and to be higher than the nitrogen concentration in the growth main step.

While employing these growth conditions, the crystal is preferably grown such that the crystal growth rate in the growth sub-step becomes 0.1 mm/h or less, and the crystal is more preferably grown at 0.05 mm/h or less. Here, since the nitrogen concentration in the crystal obtained in the growth sub-step takes a higher value than in the growth main step, the crystal is unsuitable as a product in light of application to a general device. Therefore, the growth time in the growth sub-step is preferably as short as possible in view of productivity and the crystal growth rate in the growth sub-step is preferably 0.01 mm/h or more. The thickness of the crystal grown in the growth sub-step is preferably 1 mm or more, and more preferably 3 mm or more, for more unfailingly obtaining the effect of reducing the screw dislocation by the above-described structural conversion. Since the structural conversion of a screw dislocation to a stacking fault is more reliably achieved by increasing the thickness of the crystal grown in the growth sub-step, the thickness is therefore not limited. However, considering the saturation of effect, the productivity, etc., the upper limit of the thickness of the crystal grown in the growth sub-step may be 10 mm.

After the screw dislocation in the SiC single crystal is thus converted to a stacking fault in the growth sub-step, in the present invention, the crystal is grown in a growth main step of performing major crystal growth. The growth main step of performing major crystal growth as used herein is a step of performing principal crystal growth in the method of the present invention. Specifically, the growth main step is a step tor obtaining more than 50% of the thickness of the obtained SiC single crystal, a step taking a crystal growth time accounting for more than 50% of the growth time of the SiC single crystal, a step having a highest crystal growth rate out of the steps in which the Si single crystal grows, or falls into any one or more of these steps.

In the growth main step, it is preferable to grow principally an SiC single crystal by lowering the growth atmosphere pressure compared with the growth sub-step and raising the temperature of the seed crystal to increase the crystal growth rate. Specific growth conditions may be the same as the growth conditions of an SiC single crystal by a general PVD method. However, the growth atmosphere pressure is preferably from 0.13 to 2.6 kPa (from 1 to 20 Torr), and more preferably from 0.65 to 1.95 kPa (from 5 to 15 Torr). The temperature of the seed crystal in the growth main step is set to be a higher temperature than the temperature of the seed crystal in the growth sub-step and is preferably less than 2,400° C., and more preferably from 2,200 to 2,400° C.

The nitrogen concentration in the growth main step can be appropriately set except that the nitrogen concentration is lower than that in the growth sub-step. For example, considering application to a device, in order to obtain an n-type SiC single crystal having a volume electrical resistivity of approximately from 0.005 to 0.05 Ωcm (from 5 to 50 mΩcm), the nitrogen concentration in the crystal is preferably set to be from $2\times10^{18}$ to $1\times10^{20}$ cm$^{-3}$. Alternatively, if desired, a semi-insulating SiC single crystal may be obtained by blocking the nitrogen supply.

The crystal growth rate in the growth main step is preferably set to be 0.1 mm or more per hour and is more preferably 0.3 mm/hr or more. Taking into consideration the fact that an SiC single crystal ingot is produced by the present invention and an SiC single crystal substrate is extracted from the ingot, the thickness of the SiC single crystal grown in the growth main step is preferably set to be at least 10 mm and is suitably 30 mm or more. In this connection, from the viewpoint of using existing equipment, etc., the upper limit of the crystal growth rate in the growth main step is about 1.0 mm/hr, and the upper limit of the thickness of the SiC single crystal grown in the growth main step is about 100 mm.

In the present invention, at the time of switching from the growth sub-step to the growth main step, the pressure is preferably reduced at a pressure change rate of 12 kPa or less per hour, more preferably 1 kPa or less per hour. It may be considered that as the magnitude of change per unit time is larger, the amount of time change in the growth rate is increased to make the crystal growth unstable during the pressure reduction. However, by virtue of setting the pressure change rate in the range above, concerns about mixing of a heterogeneous polytype, etc., can be unfailingly eliminated. For the same reason, at the time of switching of the growth temperature, the temperature is preferably raised at a temperature change rate of 40° C. or less per hour, and the temperature change rate is more preferably adjusted to be 10° C. or less per hour.

The present invention achieves reduction of the screw dislocation by utilizing structural change of the dislocation and is therefore not limited in the polytype of the obtained SiC single crystal, and the method is available as a method for obtaining 4H-, 6H- and 3C-silicon carbide single crystals that are representative polytypes. In particular, the present invention is advantageous in that the method is applicable also to 4H type that is favorable for device application. In addition, since the redaction of screw dislocation in the present invention can be achieved by controlling the growth conditions of the PVD method, the crystal diameter of the obtained SiC single crystal is also not limited. Accordingly, the present invention is applicable to a process for growing a crystal with a diameter of 50 to 300 mm, which is most favorable at the present time.

In the present invention, since part of the screw dislocation in the SiC single crystal is structurally converted to a stacking fault by the above-described mechanism in the growth sub-step, a facet {0001} plane is formed in the crystal peripheral part on the crystal end part of the SiC single crystal obtained in the growth main step and at the same time, the screw dislocation density is reduced in the region at a predetermined distance from the facet {0001} plane.

That is, when an SiC single crystal substrate having an off angle in a predetermined off orientation from a {0001} plane of the bulk SIC single crystal obtained by the method of the present invention is cut out from the bulk SiC single crystal, the cut-out SiC single crystal substrate has a facet {0002} plane in the peripheral part of the substrate surface on the endpoint side of a vector indicating the off orientation.

In addition, when the screw density distribution is determined along the substrate diameter away from the facet {0001} plane toward the starting point of the vector indicating the off orientation, the SiC single crystal substrate has a distribution boundary showing a sharp drop in the screw dislocation density. That is, the decrease rate of the screw dislocation density abruptly rises at the distribution boundary. Specifically, as demonstrated in Examples later, the SiC single crystal substrate of the present invention has a dislocation distribution boundary where the screw dislocation density suddenly decreases. More specifically, when the screw density distribution is determined along the substrate diameter starting from the center of the facet {0001} plane, the SiC single crystal substrate according to one embodiment of the present invention has a dislocation distribution boundary where the value of the screw dislocation density becomes 75% or less relative to the value of the screw dislocation density in the facet {0001} plane of the SiC single crystal substrate.

In a more preferred embodiment of the SiC single crystal substrate of the present invention, both the screw dislocation density distribution determined along a straight line having an angle of +45° relative to the substrate diameter in the direction away from the center of the facet {0001} plane and the screw dislocation density distribution determined along a straight line having an angle of −45° relative to the substrate diameter in the direction away from the center of the facet {0001} plane have a distribution boundary showing a sharp drop in the screw dislocation density. Accordingly, in the region opposite the facet {0001} plane across the distribution boundary of the screw dislocation density, the screw dislocation is reduced, and suitably, the screw dislocation density can be reduced to approximately from 1 to 300 dislocations/cm$^2$. When this SiC single crystal substrate is used, a high-quality SiC device can be obtained with good yield.

EXAMPLES

The present invention is described more specifically below based on Examples. However, the present invention is not limited to the contents therein.

Figure 1:
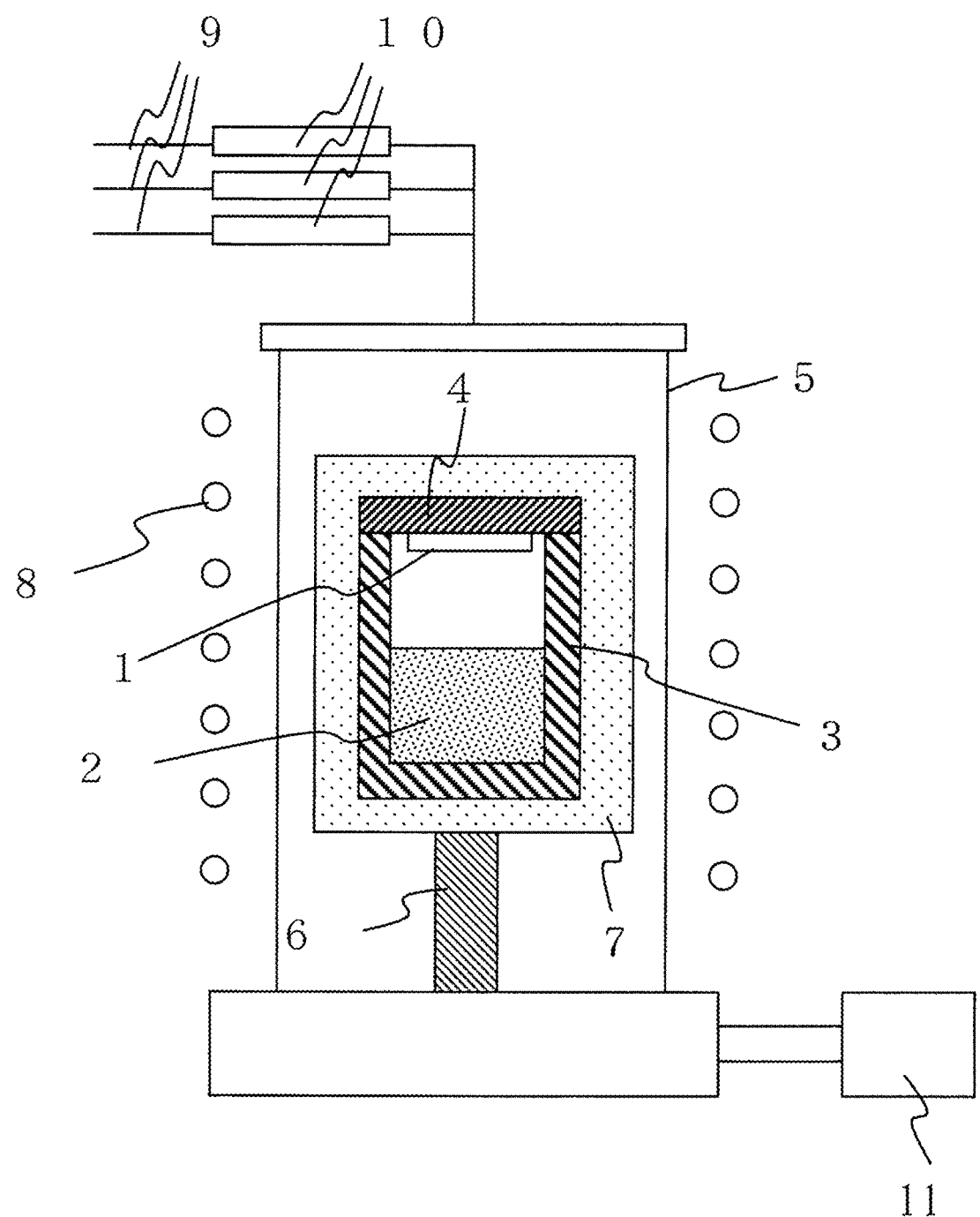
FIG. 1 A schematic configuration diagram of the single crystal growing apparatus used for producing the SiC single crystal of the present invention.

FIG. 1 is illustrates an example of the single crystal growing apparatus according to an Modified-Lely method (PVD method), which is an apparatus for producing a bulk SiC single crystal used for obtaining the SiC single crystal of the present invention. Crystal is grown by sublimating an SiC raw material 2 by induction heating to recrystallize on an SiC seed crystal 1. The SiC seed crystal 1 is attached to the inner surface of a crucible lid body 4 forming a graphite-made crucible, and the SiC raw material 2 is packed in a crucible container body 3 forming the above-mentioned graphite-made crucible. Both the crucible container body 3 and the crucible lid body 4 are covered with a graphite-made felt (heat-insulating material) 7 for the purpose of heat shielding, and the graphite-made crucible is disposed on a graphite supporting rod 6 inside a double quartz tube 5. The inside of the double quartz tube 5 was vacuum-evacuated by a vacuum pumping device 11, high-purity Ar gas and nitrogen gas were then flowed therein through a pipe 9 under the control of a mass flow controller 10, and a high frequency current was applied to a work coil 8 to heat the graphite-made crucible while adjusting the pressure in the quartz tube (growth atmosphere pressure) by the vacuum pumping device 11, whereby crystal growth was performed. Here, a light path of 2 to 4 mm in diameter was provided in the central part of the crucible lid body 4 so as to allow radiant light to be transmitted, and the temperature of the SiC seed crystal 1 was measured by means of a two-color thermometer not shown, and then the measured temperature was determined as the growth temperature as described below.

Example 1

First, a 4H SiC single crystal substrate was cut out from a previously-obtained SiC single crystal having, as the main plane, a (0001) plane with a diameter of 100 mm such that the off orientation of the (0001) plane is the <11-20> direction and the off angle of the (0001) plane is 4 degrees, and the cut-out plane was mirror-polished to prepare a seed crystal. This SiC seed crystal 1 was attached to the inner surface of the crucible lid body 4 of the single crystal growing apparatus described above and set on the crucible container body 3 of the graphite-made crucible filled with the SiC raw material 2, and the crucible was covered with a graphite-made felt 7. At this time, in the graphite-made felt 7 covering the graphite lid body 4, a heat-releasing hole (not shown) of 50 mm in diameter was provided to be concentric with the SiC single crystal attached to the inner surface of the crucible lid body 4, so that as illustrated in FIG. 4(*b*), in the process of growing of a SiC single crystal 12, the growth surface can have curved surface in the growth peripheral part and be made flat in the growth central part compared with the growth peripheral part. The graphite-made crucible (the crucible container body 3 and the crucible lid body 4) covered with the graphite-made felt 7 was put on the graphite supporting rod 6 and placed inside the double quartz tube 5.

After vacuum-evacuating the inside of the double quarts tube 5, high-purity Ar gas as an atmosphere gas was flowed therein and while maintaining the pressure in the quarts tube at about 80 kPa, the temperature was raised by applying an electric current to the work coil 8 until the temperature of the SiC seed crystal 1 reached 2,200° C. The pressure in the quartz tube was reduced to 13.3 kPa, and while adjusting the nitrogen concentration in the grown crystal to about $3\times10^{19}$ cm$^{-3}$, crystal growth for 50 hours was performed (growth sub-step). Subsequently, the pressure was reduced at a pressure change rate of 1.2 kPa/hr, the temperature was raised at a temperature change rate of 10° C./hr, and while adjusting the growth atmosphere temperature, the temperature of the SiC seed crystal 1 and the nitrogen concentration in the grown crystal to 1.3 kPa, 2,300° C. and about $1\times10^{19}$ cm$^{-3}$, respectively, crystal growth was performed for 100 hours (growth main step). Here, the nitrogen concentration (number density of nitrogen atoms) in the crystal was determined by the secondary ion mass spectrometry (SIMS) described in Jpn. J. Appl. Phys., Vol. 35 (1996), pp. 2240-2243.

In the bulk SiC single crystal (ingot) obtained through these growth sub-step and growth main step, the crystal central part on the crystal end face was flat, the crystal peripheral part had a curved surface, the external shape of the ingot was a gentle convex shape, the diameter was about 100 mm, and the highest crystal height was about 33 mm. When estimated from the results of other production examples where the crystal was grown under the same conditions in each step, it is considered that the thickness (height) of the single crystal grown in the growth sub-step as 3 mm and the thickness (height) of the single crystal grown in the growth main step is 30 mm. In addition, with respect to the obtained SiC single crystal, the end face (crystal end face) in the crystal growth direction was observed, as a result, a region having a strong dark brown contrast was observed in the crystal peripheral part on the crystal end face. The dark brown region is the facet {0001} plane, having a substantially elliptical shape with a major axis of about 15 mm and a minor axis of about 10 mm, and the center of the facet, at which the major axis and the minor axis intersect, was located at a distance of about 5 mm on the center side along the crystal end face from the outer circumference of the crystal end face of the SiC single crystal.

A (0001) plane substrate was cut out from the position at a depth of about 10 mm on the SiC seed crystal side from the crystal end face of the SiC single crystal obtained above and diamond-polished to a surface roughness Ra=about 1 nm to obtain an SiC single crystal substrate having a thickness of 400 μm and a diameter of 100 mm, in which the main plane was formed such that the off orientation of the (0001) plane was the <11-20> direction and the off angle of the (0001) plane was 4 degrees. This SiC single crystal substrate was subjected to molten KOH etching by dipping it in the molten KOH at 520° C. for 5 minutes to immerse the entire surface of the substrate, and the screw dislocation density was measured by observing the substrate surface having an off angle through an optical microscope (magnification: 80 times). Here, in accordance with the method described in J. Takahashi et al., Journal of Crystal Growth, 135 (1994), 61-70, the dislocation defects were classified by the etch pit shape by defining a small round pit as a threading edge dislocation and a middle/large hexagonal pit as a threading screw dislocation (screw dislocation) to determine the dislocation density.

Figure 8:
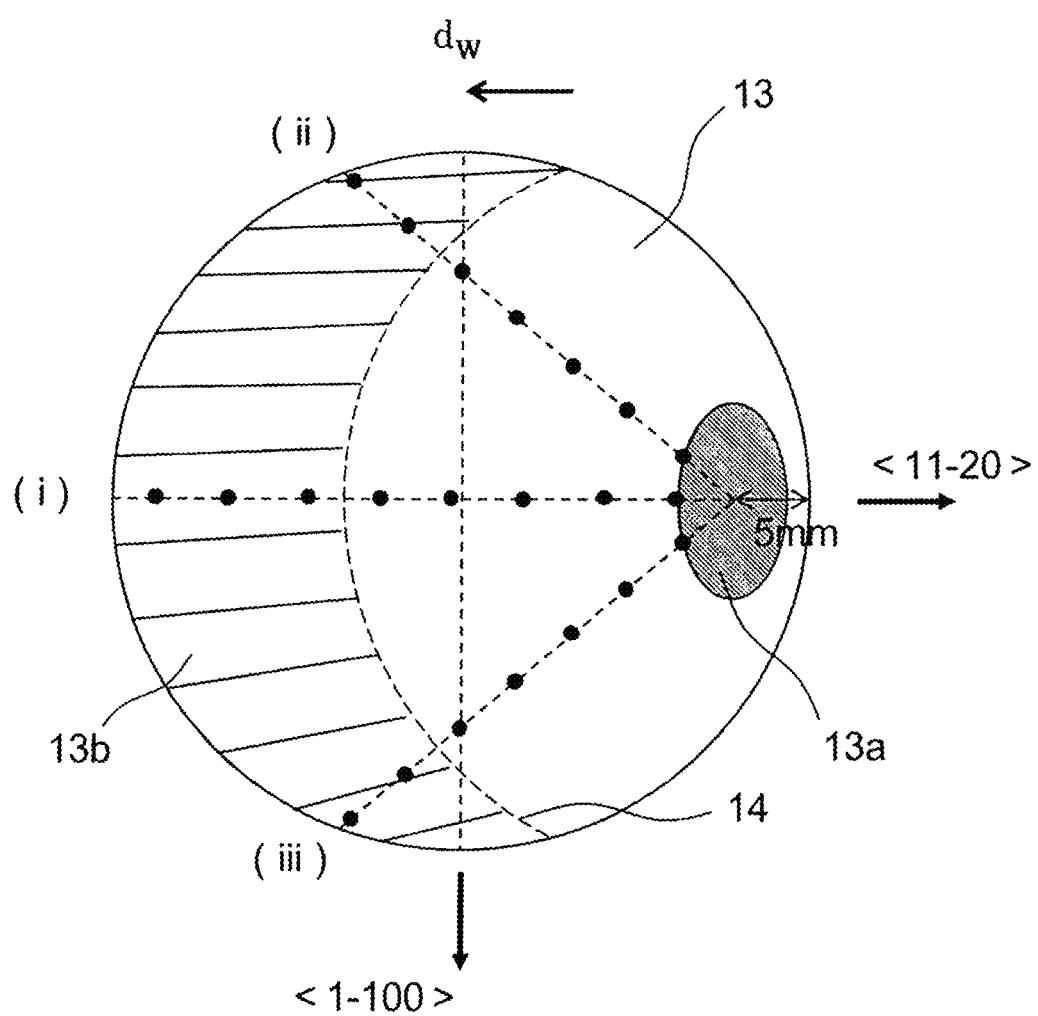
FIG. 8 A schematic plan view illustrating the measurement points of the dislocation distribution in the the screw dislocation density distribution boundary.

Here, as illustrated in FIG. 8, the dislocation distribution was examined by determining the dislocation density at measurement points on the diameter of the SiC single crystal substrate 13 extending from the center of the facet 13*a* toward the starting point of a vector indicating the off direction (i.e., toward the peripheral part opposite the facet 13*a*) in a manner away from the facet {0001} plane 13*a* (hereinafter, simply referred to as facet 13*a*) of the SiC single crystal substrate 13. In addition, as to the dislocation density at the measurement points on the direction (ii) extending from the center of the facet 13*a* toward the circumferential part on the opposite side at an angle of 45° clockwise from the direction (i) that is the diameter direction of the substrate, and the dislocation density at the measurement points on the direction (iii) extending from the center of the facet 13*a* toward the circumferential part on the opposite side at an angle of 45° counterclockwise from the direction (i), the dislocation was determined by the same technique as in the direction (i) to examine the dislocation distribution. The measurement point is the point indicated by a black circle. In all of the directions (i) to (iii), measurement points were provided at intervals of 10 mm from the boundary line (distance from the facet=0 mm) of the facet 13*a*, and the dislocation density at each measurement point was determined from the number of etch pits in a region of 4 mm×3 mm centered around each measurement point.

The results are shown together in Table 1. In all directions of (i), (ii) and (iii), at the measurement point 50 mm distant from the facet 13*a*, the screw dislocation density decreased with a drop to approximately from ½ to ⅔ of the screw dislocation density at the boundary line of the facet 13*a*. Since the screw dislocation density is sharply decreased in this way, the region between the measurement point 40 mm distant from the facet 13*a* and the measurement point 50 mm distant is considered to correspond to the distribution boundary of the screw dislocation density. In addition, as illustrated in FIG. 8, the region 13*b* opposite the facet 13*a* across the distribution boundary 14 of the screw dislocation density can be said to be a region wherein the screw dislocation is extremely decreased.

TABLE 1

Distribution State of Screw Dislocation Density in SiC Single Crystal Substrate (dislocations/cm²)

| Distance from Facet | Example 1 | | | Example 2 | | | Comparative Example 1 | | | Comparative Example 2 | | |
|---|---|---|---|---|---|---|---|---|---|---|---|---|
| | Direction (i) | Direction (ii) | Direction (iii) | Direction (i) | Direction (ii) | Direction (iii) | Direction (i) | Direction (ii) | Direction (iii) | Direction (i) | Direction (ii) | Direction (iii) |
| 0 mm | 463 | 365 | 453 | 396 | 488 | 358 | 524 | 458 | 423 | 412 | 541 | 586 |
| 10 mm | 453 | 423 | 349 | 402 | 491 | 452 | 356 | 451 | 526 | 335 | 426 | 421 |
| 20 mm | 376 | 385 | 419 | 408 | 368 | 321 | 434 | 354 | 541 | 552 | 554 | 395 |
| 30 mm | 511 | 431 | 387 | 338 | 472 | 406 | 455 | 523 | 414 | 452 | 374 | 487 |
| 40 mm | 548 | 376 | 434 | 376 | 317 | 365 | 485 | 341 | 452 | 427 | — | — |
| 50 mm | *266 | *272 | *233 | *115 | *106 | *125 | 441 | 485 | 327 | 475 | — | — |
| 60 mm | 253 | 168 | 217 | 242 | 95 | 123 | 532 | 541 | 437 | — | — | — |
| 70 mm | 208 | — | — | 74 | — | — | 452 | — | — | — | — | — |
| 80 mm | 123 | — | — | 76 | — | — | 347 | — | — | — | — | — |
| 90 mm | — | — | — | — | — | — | — | — | — | — | — | — |

*Measurement point at which the screw dislocation density decreases with a drop.

Using the remaining SiC single crystal 12 after cutting out the SiC single crystal substrate 13, a (1-100) plane substrate 15 was cut out so as to include the approximate center of the facet 13a on the crystal end face 12a of the SiC single crystal 12 and mirror-polished, and a dislocation defect and a stacking fault were observed by X-ray topography. More specifically, the longitudinal cross-section of the SiC single crystal 12 obtained in Example 1 was observed by X-ray topography.

Figure 9:
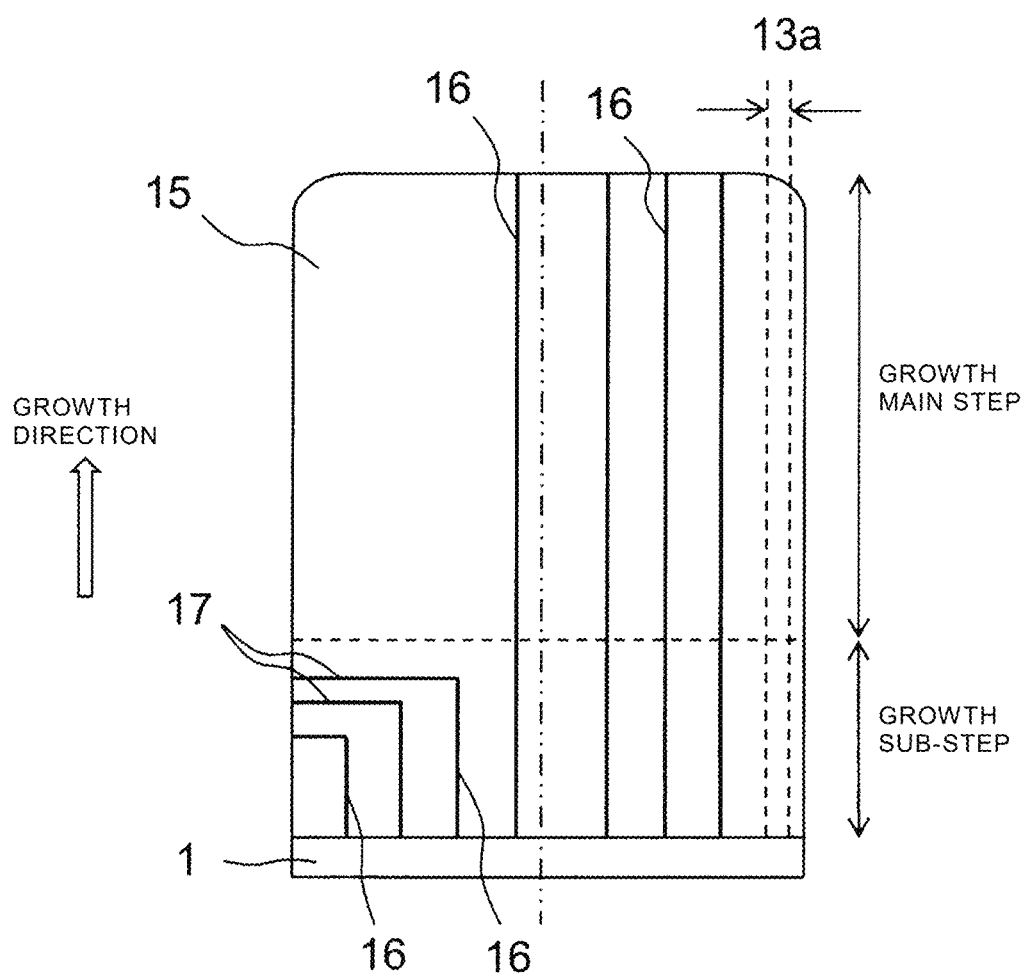
FIG. 9 A schematic cross-sectional view schematically illustrating the state of dislocation defects and stacking faults in the (1-100) longitudinal cross-section of the SiC single crystal according to Example 1.

First, an X-ray topographic picture was taken using the diffraction plane of X-ray topography as the (0004) plane, consequently, as illustrated in FIG. 9, it was observed that in the region of more than 50 mm from the center of the facet 13a, a threading dislocation defect 16 extending in parallel to the growth direction of the SiC single crystal 12 was converted to a defect 17 extending in a direction perpendicular to the growth direction. In addition, it was found from the separately performed high-resolution X-ray topographic observation that the defect extending in parallel to the growth direction is a threading screw dislocation having a Burgers vector containing a <0001> component and the defect extending in a direction substantially perpendicular to the growth direction is a Frank-Type stacking fault. More specifically, it was found that in the region more than 50 mm distant from the center of the facet 13a, the threading composite dislocation was reduced due to structural conversion of a threading composite dislocation to a stacking fault.

Example 2

The bulk SiC single crystal (ingot) according to Example 2 was obtained in the same manner as in Example 1 except that the nitrogen concentration in the crystal in the growth sub-step was adjusted to about $1 \times 10^{20}$ cm$^{-3}$ and the nitrogen concentration in the crystal in the growth main step was adjusted to be about $1 \times 10^{19}$ cm$^{-3}$.

In the bulk SiC single crystal (ingot) obtained through these growth sub-step and growth main step, the crystal central part on the crystal end face was flat, the crystal peripheral part had a curved surface, the external shape of the ingot was a gentle convex shape, the diameter was about 100 mm, and the highest crystal height was about 33 mm. When estimated from the results of other production examples where the crystal was grown under the same conditions in each step, it is considered that the thickness (height) of the single crystal grown in the growth sub-step is 3 mm and the thickness (height) of the single crystal grown in the growth main step is 30 mm. In addition, with respect to the obtained SiC single crystal, the end face (crystal end face) in the crystal growth direction was observed, as a result, a region having a strong dark brown contrast was observed in the crystal peripheral part on the crystal end face. The dark brown region is the facet {0001} plane, having a substantially elliptic shape with a major axis of about 15 mm and a minor axis of about 10 mm, and the center of the facet, at which the major axis and the minor axis intersect, was located at a distance of about 5 mm on the center side along the crystal and face from the outer circumference of the crystal end face of the SiC single crystal.

A (0001) plane substrate was cut out from the position at a depth of about 10 mm on the SiC seed crystal side from the crystal end face of the SiC single crystal obtained above and diamond-polished to a surface roughness Ra=about 1 nm to obtain an SiC single crystal substrate having a thickness of 400 μm and a diameter of 100 mm, in which the main plane was formed such that the off orientation of the (0001) plane was the <11-20> direction, and the off angle of the (0001) plane was 4 degrees. This SiC single crystal substrate was measured for the screw dislocation density by the same method as in Example 1.

The results are shown together in Table 1. In all directions of (i), (ii) and (iii), at the measurement point 50 mm distant from the facet 13a, the screw dislocation density decreased with a drop to about ⅓. From this drop in the screw dislocation density, the region between the measurement point 40 mm distant from the facet 13a and the measurement point 50 mm distant is considered to be the distribution boundary of the screw dislocation density.

Comparative Example 1

The bulk SiC single crystal (ingot) according to Comparative Example 1 was obtained in the same manner as in Example 1 except that the nitrogen concentration in the crystal in the growth sub-step was adjusted to about $5 \times 10^{18}$ cm$^{-3}$ and the nitrogen concentration in the crystal in the growth main step was adjusted to be about $1 \times 10^{19}$ cm$^{-3}$.

The shape and height of the obtained bulk SiC single crystal (ingot) were substantially the same as in Examples 1 and 2, and the thickness (height) of each of the single crystals grown in the growth sub-step and the growth main step is considered to be the same as well. In addition, with respect to the facet {0001} plane on the crystal end face of the obtained SiC single crystal, both the size and the position were also the same as in Examples 1 and 2.

A (0001) plane substrate was cut out from the position at a depth of about 10 mm on the SiC seed crystal side from the crystal end face of the SiC single crystal obtained above and diamond-polished to a surface roughness Ra=about 1 nm to obtain an SiC single crystal substrate having a thickness of 400 μm and a diameter of 100 mm such that the off orientation of the (0001) plane was the <11-20> direction and the off angle of the (0001) plane was 4 degrees. This SiC single crystal substrate was measured for the screw dislocation density by the same method as in Example 1.

The results are shown together in Table 1. In all directions of (i), (ii) and (iii), a region showing a decrease in the screw dislocation density was not confirmed, and a regularity such that the screw dislocation density decreased with a drop could not be found.

Similarly to Example 1, using the remaining SiC single crystal 12 after cutting out the SiC single crystal substrate 13, a (1-100) plane substrate 15 was cut out so as to include the approximate center of the facet 13a on the crystal end face 12a of the SiC single crystal 12 and mirror-polished, and a dislocation defect and a stacking fault were observed by X-ray topography. An X-ray topographic picture was taken using the diffraction plane of X-ray topography as the (0004) plane. From the x-ray topographic picture, it was observed that a threading screw dislocation extends in parallel to the growth direction, and conversion to a stacking fault was substantially not observed.

Comparative Example 2

The bulk SiC single crystal (ingot) according to Comparative Example 2 was obtained in the same manner as in Example 1 except that a heat-releasing hole with a diameter 20 mm was provided to become concentric with the SiC single crystal attached to the inner surface of the crucible lid body 4, the nitrogen concentration in the crystal in the growth sub-step was adjusted to about $1\times10^{20}$ cm$^{-3}$ and the nitrogen concentration in the crystal in the growth main step was adjusted to be about $1\times10^{19}$ cm$^{-3}$.

The bulk SiC single crystal (ingot) obtained through these growth sub-step and growth main step had a curved surface over a region from the crystal central part to the crystal peripheral part, and the external shape of the ingot was a gentle convex shape. The shape and height of the obtained bulk SiC single crystal (ingot) were substantially the same as in Example 1, and the thickness (height) of each of the single crystals grown in the growth sub-step and the growth main step is considered to be the same as well. In addition, with respect to the obtained SiC single crystal, a region having a strong dark brown contrast was observed in the crystal peripheral part on the crystal end face. The dark brown region is the facet {0001} plane, having a approximate elliptic shape with a major axis of about 15 mm and a minor axis of about 10 mm, and the center of the facet, at which the major axis and the minor axis intersect, was located substantially in the center of the crystal end face at a distance of about 45 mm on the center side along the crystal end face from the outer circumference of the crystal end face of the SiC single crystal.

A (0001) plane substrate was cut out from the position at a depth of about 10 mm on the SiC seed crystal side from the crystal end face of the SiC single crystal obtained above and diamond-polished to a surface roughness Ra=about 1 nm to obtain an SiC single crystal substrate having a thickness of 400 μm and a diameter of 100 mm, in which the main plane was formed such that the off orientation of the (0001) plane was the <11-20> direction and the off angle of the (0001) plane was 4 degrees. This SiC single crystal substrate was measured for the screw dislocation density by the same method as in Example 1.

The results are shown together in Table 1. In all directions of (i), (ii) and (iii), a region showing a decrease in the screw dislocation density was not confirmed, and a regularity such that the screw dislocation density decreased with a drop could not be found.

DESCRIPTION OF NUMERICAL REFERENCES

1: SiC Seed crystal, 2: SiC raw material, 3: crucible container body, 4: crucible lid body, 5: double quartz tube: 6: graphite supporting rod, 7: graphite-made felt (heat-insulating material), 8: work coil, 9: pipe, 10: mass flow controller, 11: vacuum pumping device: 12: SiC single crystal: 12a: crystal end face: 13: SiC single crystal substrate, 13a: facet {0001} plane, 13b: screw dislocation-reduced region, 14: distribution boundary of screw dislocation density, 15: (1-100) plane substrate, 18: heat-releasing hole.

The invention claimed is:

1. A method for producing a silicon carbide single crystal, comprising placing a seed crystal composed of silicon carbide on a crucible lid body of a crucible having a crucible container body and the crucible lid body, placing a silicon carbide raw material in the crucible container body, and sublimating the silicon carbide raw material to grow a bulk silicon carbide single crystal on the seed crystal, wherein
the seed crystal has an off angle in an off orientation from a {0001} plane,
wherein in advance of a growth main step of performing crystal growth to form a facet {0001} plane in a crystal peripheral part on a crystal end face having grown thereon the bulk silicon carbide single crystal and obtain more than 50% of a thickness of the obtained SiC single crystal, said method comprises a growth sub-step of growing the crystal at (i) a higher nitrogen concentration than in the growth main step, (ii) a growth atmosphere pressure of 3.9 to 39.9 kPa, (iii) a seed crystal temperature of 2,100° C. to less than 2,300° C., and (iv) a crystal growth rate of 0.1 mm/h or less,
wherein the nitrogen concentration in the crystal in the growth sub-step is from $2\times10^{19}$ to $1\times10^{20}$ cm$^{-3}$, and
wherein in the growth main step, the nitrogen concentration in the crystal is from $1\times10^{18}$ to $1\times10^{20}$ cm$^{-3}$.

2. The method for producing a silicon carbide single crystal according to claim 1, wherein in the growth main step, the growth atmosphere pressure is from 0.13 to 2.6 kPa, and the temperature of the seed crystal is higher than in the growth sub-step and is less than 2,400° C.

3. The method for producing a silicon carbide single crystal according to claim 1, wherein the facet {0001} plane is formed by forming the bulk silicon carbide single crystal on the main plane of the seed crystal such that in the process of growing of a bulk silicon carbide single crystal, the growth surface comes to have a curved surface in the growth peripheral part and be made flat in the growth central part compared with the growth peripheral part.

4. The method for producing a silicon carbide single crystal according to claim 1, wherein the bulk silicon carbide single crystal is grown in the growth sub-step until the thickness of the bulk silicon carbide single crystal increases by 1 mm or more, and structural conversion of part of the screw dislocation in the silicon carbide single crystal to a stacking fault and reduction in the screw dislocation density in a region separated from the facet {0001} plane on the crystal end face of the silicon carbide single crystal are thereby achieved in the growth sub-step.

\* \* \* \* \*